(12) United States Patent
Kang

(10) Patent No.: US 11,431,341 B2
(45) Date of Patent: Aug. 30, 2022

(54) SYNCHRONIZATION CIRCUIT, A SERIALIZER USING THE SYNCHRONIZATION CIRCUIT, AND A DATA OUTPUT CIRCUIT USING THE SYNCHRONIZATION CIRCUIT AND THE SERIALIZER

(71) Applicant: SK hynix Inc., Icheon-si (KR)

(72) Inventor: Ji Hyo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/226,648

(22) Filed: Apr. 9, 2021

(65) Prior Publication Data
US 2022/0131544 A1    Apr. 28, 2022

(30) Foreign Application Priority Data

Oct. 28, 2020  (KR) .................. 10-2020-0141132

(51) Int. Cl.
*H03K 19/096*    (2006.01)
*H03K 3/356*    (2006.01)

(52) U.S. Cl.
CPC ... *H03K 19/0963* (2013.01); *H03K 3/356121* (2013.01)

(58) Field of Classification Search
None
See application file for complete search history.

(56) References Cited

U.S. PATENT DOCUMENTS 10,193,539 B1 *   1/2019   Choi .................. H03K 21/10

FOREIGN PATENT DOCUMENTS

KR         101978199 B1     5/2019

* cited by examiner

*Primary Examiner* — Jany Richardson
(74) *Attorney, Agent, or Firm* — William Park & Associates Ltd.

(57) ABSTRACT

A synchronization circuit includes a precharge circuit and a signal driving circuit. The precharge circuit precharges an output node to a first logic level. The signal driving circuit detects, in synchronization with a second dock signal having a phase leading a first clock signal, a logic level of an input signal and drives, in synchronization with the first clock signal, the output node to a second logic level according to the logic level of the input signal.

19 Claims, 11 Drawing Sheets

SYNCHRONIZATION CIRCUIT, A SERIALIZER USING THE SYNCHRONIZATION CIRCUIT, AND A DATA OUTPUT CIRCUIT USING THE SYNCHRONIZATION CIRCUIT AND THE SERIALIZER

CROSS-REFERENCES TO RELATED APPLICATION

The present application claims priority under 35 U.S.C. § 119(a) to Korean application number 10-2020-0141132, filed on Oct. 28, 2020, in the Korean Intellectual Property Office, which is incorporated herein by reference in its entirety as set forth in full.

BACKGROUND

1. Technical Field

Various embodiments generally relate to an integrated circuit technology, and, more particularly, to a synchronization circuit, a serializer using the synchronization circuit, a data output circuit using the synchronization circuit and the serializer.

2. Related Art

An electronic device includes a plurality of electronic dements and a computer system as the electronic device includes a plurality of semiconductor apparatuses. The semiconductor apparatuses forming the computer system may communicate with each other by transmitting and receiving a dock signal and data. The semiconductor apparatuses may be coupled to each other through a bus and/or a signal transmission line and may transmit and receive the clock signal and data. The serial data may be transmitted through a data bus. On the other hand, parallel data is utilized within the semiconductor apparatus in order to increase an amount of data to be processed at a time. Therefore, to accommodate both types of data, the semiconductor apparatus is provided with a parallelizer and a serializer. The parallelizer is configured to convert the serial data, which is provided through the data bus, into parallel data, and the serializer is configured to convert parallel data into serial data to be output through the data bus. The serializer is configured to synchronize a plurality of data pieces with dock signals having different phases for sequential output of the plurality of data pieces. The serializer may include a plurality of multiplexers configured to synchronize the plurality of data pieces with the dock signals having different phases. According to a prior art, there are a great number of stages of elements included in the multiplexer, which cause a load increase of an output node of the serializer. As the load of the output node increases, a slope of an output signal of the serializer decreases, which makes it difficult for the serializer to perform a high-speed operation.

SUMMARY

In an embodiment, a synchronization circuit may include a precharge circuit and a signal driving circuit. The precharge circuit may be configured to precharge an output node to a first logic level. The signal driving circuit may be configured to receive a first clock signal, a second dock signal, and an input signal, configured to detect, in synchronization with the second clock signal, a logic level of the input signal, and configured to drive, in synchronization with the first dock signal, the output node to a second logic level according to the logic level of the input signal. The second dock signal may have a phase leading the first dock signal.

In an embodiment, a synchronization circuit may include a pull-up driver, a pull-up control driver, a first pull-down control driver, a second pull-down control driver, and a pull-down driver. The pull-up driver may be configured to drive an output node to a first logic level based on an enable signal. The pull-up control driver may be configured to drive a pull-down control signal to a first logic level based on an input signal and a second dock signal. The first pull-down control driver may be configured to drive the pull-down control signal to a second logic level based on a first dock signal. The second pull-down control driver may be configured to drive the pull-down control signal to the second logic level based on the second dock signal. The pull-down driver may be configured to drive the output node to a second logic level based on the pull-down control signal. The second dock signal may have a phase leading the first dock signal.

In an embodiment, a serializer may include a first synchronization circuit, a second synchronization circuit, a third synchronization circuit, and a fourth synchronization circuit. The first synchronization circuit may be configured to drive an output node to a logic level corresponding to a first input signal based on a first dock signal and a fourth clock signal having a phase leading the first clock signal by an amount of a unit phase. The second synchronization circuit may be configured to drive the output node to a logic level corresponding to a second input signal based on a second clock signal and the first clock signal having a phase leading the second clock signal by the amount of the unit phase. The third synchronization circuit may be configured to drive the output node to a logic level corresponding to a third input signal based on a third clock signal and the second clock signal having a phase leading the third clock signal by the amount of the unit phase. The fourth synchronization circuit may be configured to drive the output node to a logic level corresponding to a fourth input signal based on the fourth clock signal and the third clock signal.

In an embodiment, a serializer may include a precharge circuit, a first synchronization circuit, a second synchronization circuit, a third synchronization circuit, and a fourth synchronization circuit. The precharge circuit may be configured to precharge an output node a first logic level. The first synchronization circuit may be configured to receive a first clock signal, a fourth clock signal, and a first input signal, configured to detect a logic level of the first input signal at a falling edge of the fourth clock signal and configured to drive the output node to a second logic level based on the logic level of the first input signal in a period from a falling edge of the first clock signal to a rising edge of the fourth clock signal. The fourth dock signal may have a phase leading the first dock signal by an amount of a unit phase. The second synchronization circuit may be configured to receive a second dock signal, the first dock signal and a second input signal, configured to detect a logic level of the second input signal at the falling edge of the first dock signal and configured to drive the output node to the second logic level based on the logic level of the second input signal in a period from a falling edge of the second clock signal to a rising edge of the first clock signal. The first clock signal may have a phase leading the second clock signal by the amount of the unit phase. The third synchronization circuit may be configured to receive a third clock signal, the second clock signal and a third input signal, configured to detect a logic level of the third input signal at the falling edge of the second clock signal, and configured to drive the output node to the second logic level based on the logic level of the third input signal in a period from a falling edge of the third clock signal to a rising edge of the second clock signal. The second clock signal may have a phase leading the third clock signal by the amount of the unit phase. The fourth synchronization circuit may be configured to receive the fourth clock signal, the third clock signal and a fourth input signal, configured to detect a logic level of the fourth input signal at the falling edge of the third clock signal, and configured to drive the output node to the second logic level based on the logic level of the fourth input signal in a period from a falling edge of the fourth clock signal to a rising edge of the third clock signal.

In an embodiment, a data output circuit may include a serializer, a pre-driver, and a main driver. The serializer may be configured to output a plurality of data signals as a serial data signal based on a first clock signal, a second clock signal, a third clock signal, and a fourth clock signal, which sequentially have a phase difference corresponding to an amount of a unit phase with each other. The pre-driver may be configured to generate an output control signal based on the serial data signal. The main driver may be configured to drive a data transmission line to a first logic level or a second logic level based on the output control signal. The serializer may include a first synchronization circuit, a second synchronization circuit, a third synchronization circuit, and a fourth synchronization circuit. The first synchronization circuit may be configured to generate the serial data signal having a logic level corresponding to a first data signal based on the first clock signal and the fourth clock signal. The second synchronization circuit may be configured to generate the serial data signal having a logic level corresponding to a second data signal based on the second clock signal and the first clock signal. The third synchronization circuit may be configured to generate the serial data signal having a logic level corresponding to a third data signal based on the third clock signal and the second clock signal. The fourth synchronization circuit may be configured to generate the serial data signal having a logic level corresponding to a fourth data signal based on the fourth clock signal and the third clock signal.

In an embodiment, a data output circuit may include a serializer, a pre-driver and a main driver. The serializer may be configured to output a plurality of data signals as a serial data signal based on a first dock signal, a second dock signal, a third dock signal, and a fourth dock signal, which sequentially have a phase difference corresponding to an amount of a unit phase with each other. The pre-driver may be configured to generate an output control signal based on the serial data signal. The main driver may be configured to drive a data transmission line to a first logic level or a second logic level based on the output control signal. The serializer may include a precharge circuit, a first synchronization circuit, a second synchronization circuit, a third synchronization circuit, and a fourth synchronization circuit. The precharge circuit may be configured to precharge an output node, through which the serial data signal is output, to a first logic level. The first synchronization circuit may be configured to receive the first clock signal, the fourth clock signal, and a first data signal and configured to drive the output node to a second logic level based on the first data signal in a period from a falling edge of the first clock signal to a rising edge of the fourth clock signal. The second synchronization circuit may be configured to receive the second clock signal, the first clock signal, and a second data signal and configured to drive the output node to the second logic level based on the second data signal in a period from a falling edge of the second clock signal to a rising edge of the first clock signal. The third synchronization circuit may be configured to receive the third clock signal, the second clock signal and a third data signal and configured to drive the output node to the second logic level based on the third data signal in a period from a falling edge of the third dock signal to a rising edge of the second dock signal. The fourth synchronization circuit may be configured to receive the fourth dock signal, the third dock signal and a fourth data signal and configured to drive the output node to the second logic level based on the fourth data signal in a period from a falling edge of the fourth dock signal to a rising edge of the third dock signal.

In an embodiment, a data output circuit may include a first serializer, a second serializer, a pre-driver, and a main driver. The first serializer may be configured to sequentially output a plurality of data signals as a first serial data signal based on a first dock signal, a second clock signal, a third clock signal, and a fourth clock signal, which sequentially have a phase difference corresponding to an amount of a unit phase with each other. The second serializer may be configured to sequentially output the plurality of data signals as a second serial data signal based on the first clock signal, the second clock signal, the third clock signal, and the fourth clock signal. The pre-driver may be configured to generate a first output control signal based on the first serial data signal and configured to generate a second output control signal based on the second serial data signal. The main driver may be configured to drive a data transmission line to a first logic level or a second logic level based on the first output control signal and the second output control signal.

DETAILED DESCRIPTION

Figure 1:
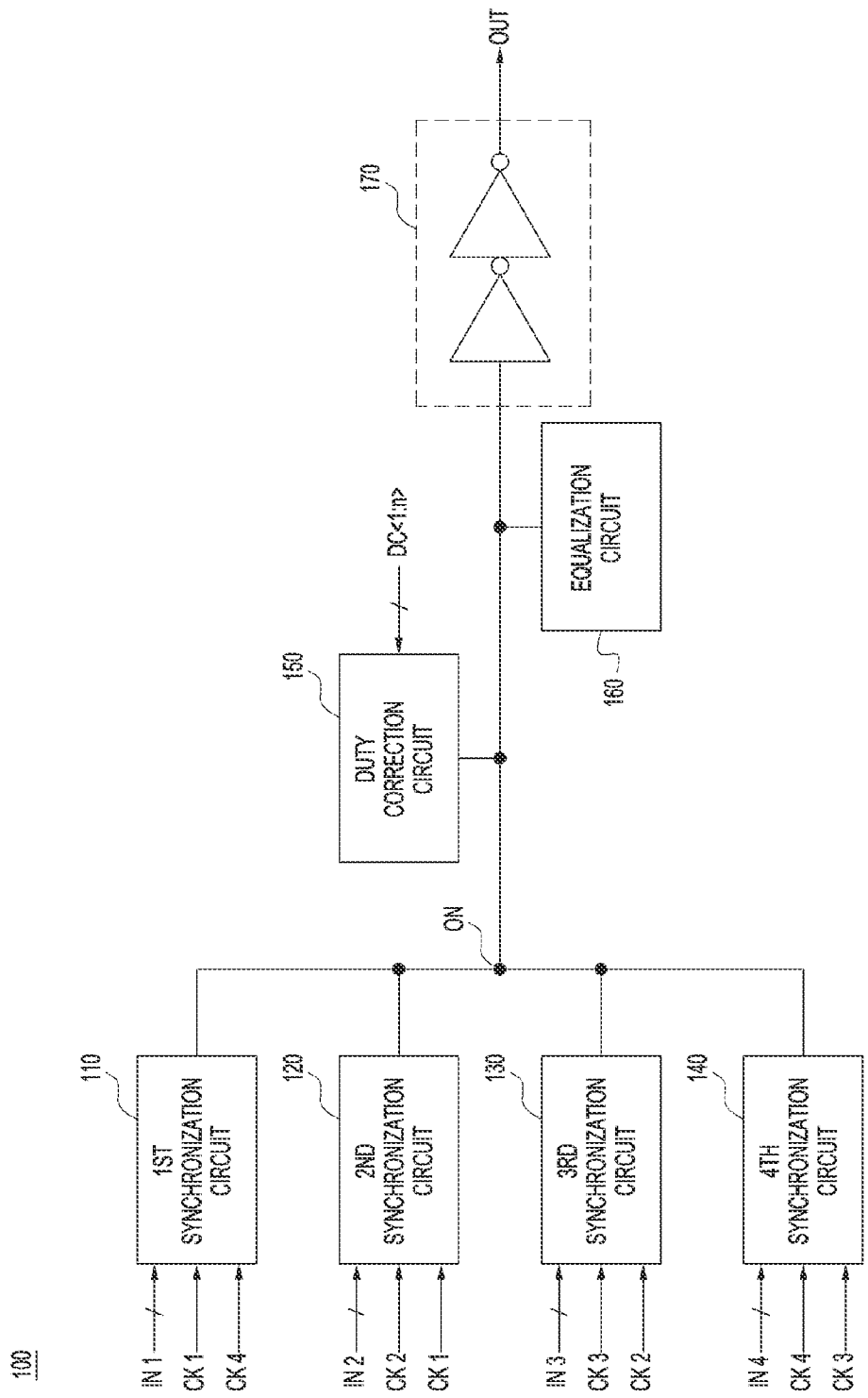
FIG. 1 is a diagram of an example illustrating a configuration of a serializer in accordance with an embodiment of the present disclosure.

FIG. 1 is a diagram illustrating an example of a configuration of a serializer 100 in accordance with an embodiment of the present disclosure, Referring to FIG. 1, the serializer 100 may sequentially output a plurality of input signals as an output signal OUT based on a first clock signal CK1, a second clock signal CK2, a third clock signal CK3 and a fourth clock signal CK4, wherein the first to fourth clock signals CK1, CK2, CK3, and CK4 may have the same frequency. However, the present disclosure is not limited thereto. Ain other words, more than four clock signals may be used, but are not illustrated herein. The first to fourth clock signals CK1, CK2, CK3, and CK4 may sequentially have a phase difference corresponding to an amount of a unit phase with each other. For example, the first clock signal CK1 may have a phase leading the second clock signal CK2 by a predetermined amount of the unit phase. In addition, the second clock signal CK2 may have a phase leading the third clock signal CK3 by a predetermined amount of the unit phase, and the third clock signal CK3 may have a phase leading the fourth clock signal CK4 by a predetermined amount of the unit phase. Also, the fourth clock signal CK4 may have a phase leading the first clock signal CK1 by a predetermined amount of the unit phase. Generally, the unit phase may correspond to 90° and may correspond to a quarter of the period of the first dock signal CK1, The plurality of input signals may include at least two input signals but is not limited thereto. That is, where desired, more than two input signals may be used. To clarify the present example shown in FIG. 1, in which the serializer 100 is configured to receive the input signals, a number of the input signals corresponds to a number of synchronization circuits included in the serializer 100.

Thus, as illustrated in FIG. 1, in an embodiment there are four input signals and four synchronization circuits (one for each input signal). The serializer 100 may include a first synchronization circuit 110, a second synchronization circuit 120, a third synchronization circuit 130 and a fourth synchronization circuit 140. The first synchronization circuit 110 may receive the first dock signal CK1, the fourth clock signal CK4 and a first input signal IN1. The second synchronization circuit 120 may receive the second clock signal CK2, the first clock signal CK1 and a second input signal IN2. The third synchronization circuit 130 may receive the third clock signal CK3, the second clock signal CK2 and a third input signal IN3. The fourth synchronization circuit 140 may receive the fourth clock signal CK4, the third clock signal CK3 and a fourth input signal IN4. The first to fourth synchronization circuits 110, 120, 130, and 140 may be commonly coupled to an output node ON. The output signal OUT may be generated through the output node ON, The first to fourth synchronization circuits 110, 120, 130, and 140 may sequentially output the first to fourth input signals IN1, IN2, IN3 and IN4, respectively, as the output signal OUT, wherein the first to fourth input signals IN1, IN2, IN3, and IN4 may be synchronized with the first to fourth dock signals CK1, CK2, CK3, and CK4, respectively. Each of the first to fourth input signals IN1, IN2, IN3 and IN4 may include a plurality of information pieces, wherein the plurality of information pieces may change at predetermined unit intervals (hereinafter, referred to as 'UIs'), For example, in one embodiment, the predetermined UI may correspond to a single period of the first clock signal CK1.

In an embodiment, based on the first clock signal CK1 and the fourth clock signal CK4, the first synchronization circuit 110 may generate the output signal OUT having a logic level corresponding to the first input signal IN1, In synchronization with the fourth clock signal CK4 having the leading phase, the first synchronization circuit 110 may detect a logic level of the first input signal IN1, and in synchronization with the first clock signal CK1, the first synchronization circuit 110 may generate the output signal OUT corresponding to the logic level of the first input signal IN1 so that the first synchronization circuit 110 may detect the logic level of the first input signal IN1 at a falling edge of the fourth clock signal CK4, Hence, the first synchronization circuit 110 may generate the output signal OUT having the logic level corresponding to the first input signal IN1 in a period from a falling edge of the first clock signal CK1 to a rising edge of the fourth clock signal CK4. The first synchronization circuit 110 may precharge the output node ON to a first logic level. Further, in a period when both the first dock signal CK1 and the fourth dock signal CK4 have a second logic level, the first synchronization circuit 110 may drive the output node ON to the second logic level based on the first input signal IN1. For example, the first logic level may be a high logic level and the second logic level may be a low logic level. The first synchronization circuit 110 may precharge, repeatedly during an operation, the output node ON to a high logic level so that in the period when both the first clock signal CK1 and the fourth clock signal CK4 have a low logic level, the first synchronization circuit 110 may drive the output node ON to a low logic level because the first input signal IN1 has a low logic level and may not drive the output node ON to a low logic level when the first input signal IN1 has a high logic level.

In one embodiment, based on the second clock signal CK2 and the first clock signal CK1, the second synchronization circuit 120 may generate the output signal OUT having a logic level corresponding to the second input signal IN2. In synchronization with the first clock signal CK1 having the leading phase, the second synchronization circuit 120 may detect a logic level of the second input signal IN2 and in synchronization with the second clock signal CK2, the second synchronization circuit 120 may generate the output signal OUT corresponding to the logic level of the second input signal IN2, Hence, the second synchronization circuit 120 may detect the logic level of the second input signal IN2 at a falling edge of the first dock signal CK1 so that the second synchronization circuit 120 may generate the output signal OUT having the logic level corresponding to the second input signal IN2 in a period from a falling edge of the second clock signal CK2 to a rising edge of the first clock signal CK1. Then, the second synchronization circuit 120 may precharge the output node ON to the first logic level. Hence, in a period when both the second clock signal CK2 and the first clock signal CK1 have the second logic level, the second synchronization circuit 120 may drive the output node ON to the second logic level based on the second input signal IN2. The second synchronization circuit 120 may precharge, repeatedly during an operation, the output node ON to a high logic level. That is, in the period when both the second clock signal CK2 and the first clock signal CK1 have a low logic level, the second synchronization circuit 120 may drive the output node ON to a low logic level because the second input signal IN2 has a low logic level and may not drive the output node ON to a low logic level when the second input signal IN2 has a high logic level.

In one embodiment, based on the third clock signal CK3 and the second clock signal CK2, the third synchronization circuit 130 may generate the output signal OUT having a logic level corresponding to the third input signal IN3, In synchronization with the second clock signal CK2 having the leading phase, the third synchronization circuit 130 may detect a logic level of the third input signal IN3 and in synchronization with the third clock signal CK3, the third synchronization circuit 130 may generate the output signal OUT corresponding to the logic level of the third input signal IN3. The third synchronization circuit 130 may detect the logic level of the third input signal IN3 at a falling edge of the second clock signal CK2, Hence, the third synchronization circuit 130 may generate the output signal OUT having the logic level corresponding to the third input signal IN3 in a period from a falling edge of the third clock signal CK3 to a rising edge of the second clock signal CK2. The third synchronization circuit 130 may precharge the output node ON to the first logic level and in a period when both the third clock signal CK3 and the second clock signal CK2 have the second logic level, the third synchronization circuit 130 may drive the output node ON to the second logic level based on the third input signal IN3. The third synchronization circuit 130 may precharge, repeatedly during an operation, the output node ON to a high logic level so that in the period when both the third clock signal CK3 and the second clock signal CK2 have a low logic level, the third synchronization circuit 130 may drive the output node ON to a low logic level because the third input signal IN3 has a low logic level and may not drive the output node ON to a low logic level when the third input signal IN3 has a high logic level.

In one embodiment, based on the fourth clock signal CK4 and the third clock signal CK3, the fourth synchronization circuit 140 may generate the output signal OUT having a logic level corresponding to the fourth input signal IN4. In synchronization with the third clock signal CK3 having the leading phase, the fourth synchronization circuit 140 may detect a logic level of the fourth input signal IN4 and in synchronization with the fourth dock signal CK4, the fourth synchronization circuit 140 may generate the output signal OUT corresponding to the logic level of the fourth input signal IN4. The fourth synchronization circuit 140 may detect the logic level of the fourth input signal IN4 at a falling edge of the third clock signal CK3. Hence, the fourth synchronization circuit 140 may generate the output signal OUT having the logic level corresponding to the fourth input signal IN4 in a period from a falling edge of the fourth clock signal CK4 to a rising edge of the third clock signal CK3. The fourth synchronization circuit 140 may precharge the output node ON to the first logic level so that in a period when both the fourth clock signal CK4 and the third clock signal CK3 have the second logic level, the fourth synchronization circuit 140 may drive the output node ON to the second logic level based on the fourth input signal IN4, The fourth synchronization circuit 140 may precharge, repeatedly during an operation, the output node ON to a high logic level so that in the period when both the fourth clock signal CK4 and the third clock signal CK3 have a low logic level, the fourth synchronization circuit 140 may drive the output node ON to a low logic level because the fourth input signal IN4 has a low logic level and may not drive the output node ON to a low logic level when the fourth input signal IN4 has a high logic level.

As illustrated in FIG. 1, the serializer 100 may further include a duty correction circuit 150 wherein the duty correction circuit 150 may be coupled to the output node ON. The duty correction circuit 150 may receive a duty control signal DC<1:n> ('n' is 2 or a greater integer) and may adjust the phase of the output signal OUT, which is output from the output node ON, based on the duty control signal DC<1:n>. The duty control signal DC<1:n> may have a dynamically changing value through monitoring a duty ratio of the output signal OUT, which is output from the serializer 100. Alternatively, the duty control signal DC<1:n> may have a predetermined value in consideration of the operation characteristics of the serializer 100. The serializer 100 may further include an equalization circuit 160, wherein the equalization circuit 160 may perform a pre-emphasis and/or a de-emphasis operation on the output node ON, Based on a voltage level of the output node ON, which changes based on any one of the first to fourth input signals IN1, IN2, IN3, and IN4, the equalization circuit 160 may additionally change the voltage level of the output node ON. The equalization circuit 160 may include any known equalization circuit, any known pre-emphasis circuit or any known de-emphasis circuit. The serializer 100 may further include an output buffer circuit 170, wherein the output buffer circuit 170 may be coupled to the output node ON and may buffer the output signal OUT. In one embodiment, the output buffer circuit 170 may include an even number of inverters.

Figure 2:
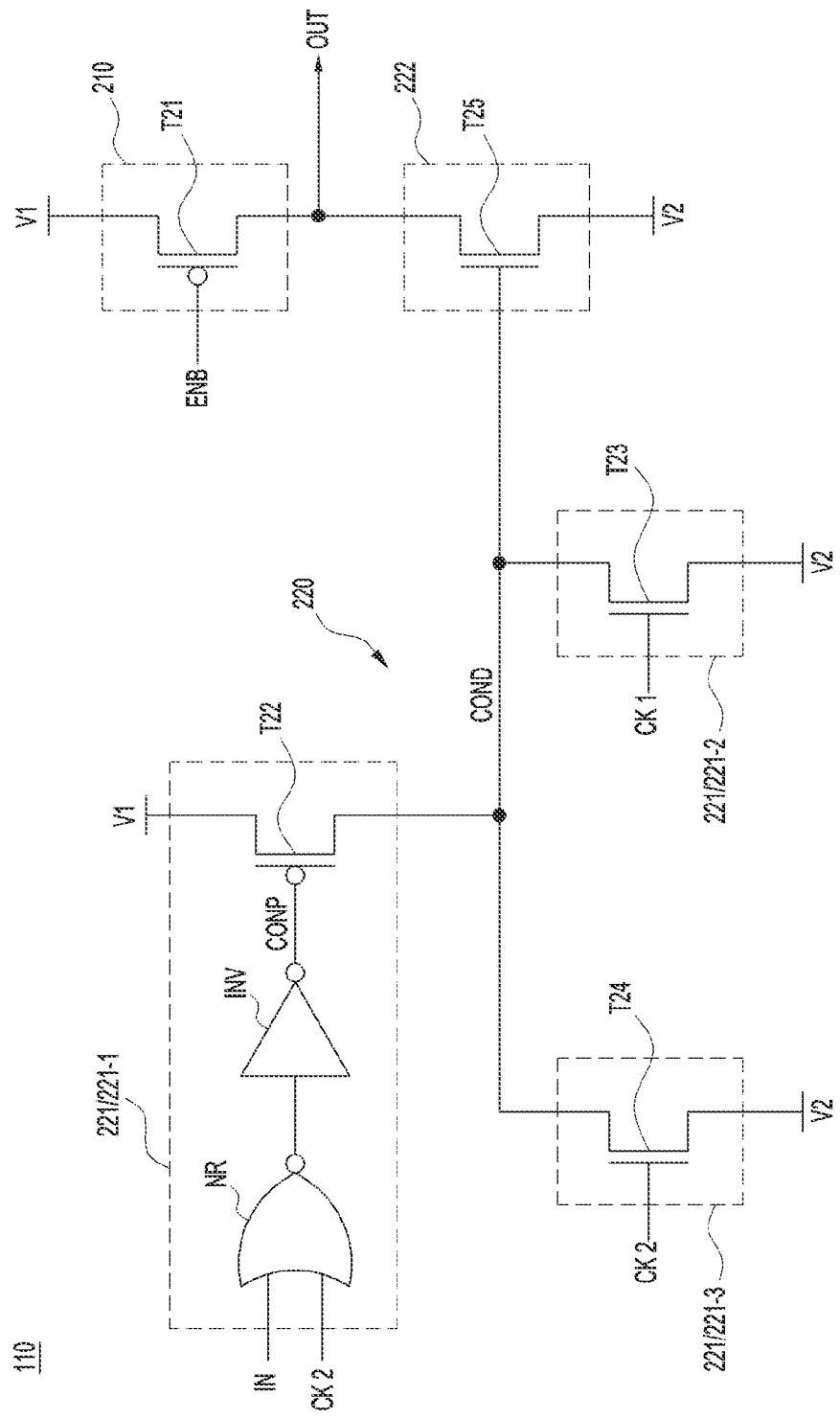
FIG. 2 is a diagram illustrating an example of a configuration of a first synchronization circuit illustrated in FIG. 1.

FIG. 2 is a diagram illustrating a configuration of an embodiment of the first synchronization circuit 110 illustrated in FIG. 1, Each of the second to third synchronization circuits 120, 130, and 140 may have the same configuration as the first synchronization circuit 110 except for the input signals. Referring to FIG. 2, the first synchronization circuit 110 may include a precharge circuit 210 and a signal driving circuit 220. The precharge circuit 210 may precharge the output node ON during an operation of the first synchronization circuit 110, The precharge circuit 210 may precharge the output node ON to the first logic level. The signal driving circuit 220 may receive the first dock signal CK1, the fourth dock signal CK4 and the first input signal IN1. In the period when both the first dock signal CK1 and the fourth dock signal CK4 have the second logic level, the signal driving circuit 220 may selectively drive the output node ON to the second logic level based on the first input signal IN1. When the first input signal IN1 has the first logic level, the signal driving circuit 220 may not drive the output node ON to the second logic level. However, when the first input signal IN1 has the second logic level, the signal driving circuit 220 may drive the output node ON to the second logic level. The drivability, with which the signal driving circuit 220 drives the output node ON to the second logic level, may be greater than the drivability, with which the precharge circuit 210 precharges the output node ON.

The precharge circuit 210 may include a first transistor T21, The first transistor T21 may be coupled between the output node ON and a node, from which a first voltage V1 is provided, and may receive an enable signal ENB at its gate. The first voltage V1 may have a voltage level high enough to be determined as a high logic level. The enable signal ENB may stay enabled while the first synchronization circuit 110 operates. The first transistor T21 may be a pull-up control driver configured to pull-up drive the output node ON to the first voltage V1 based on the enable signal ENB. The first transistor T21 may be a P-channel MOS transistor. When the enable signal ENB is enabled to a low logic level, the first transistor T21 may provide the first voltage V1 to the output node ON to precharge the output node ON to the voltage level of the first voltage V1.

The signal driving circuit 220 may include a pull-down control circuit 221 and a pull-down control driver 222. The pull-down control circuit 221 may receive the first clock signal CK1, the fourth clock signal CK4 and the first input signal IN1 to generate a pull-down control signal COND. In the period when both the first clock signal CK1 and the fourth clock signal CK4 have the second logic level, the pull-down control circuit 221 may generate the pull-down control signal COND according to the logic level of the first input signal IN1. In the period when any one between the first clock signal CK1 and the fourth clock signal CK4 has the first logic level, the pull-down control circuit 221 may drive the pull-down control signal COND to the second logic level. When both the second logic level and the first input signal IN1 has the second logic level, the pull-down control circuit 221 may drive the pull-down control signal COND to the first logic level. When both the first clock signal CK1 and the fourth clock signal CK4 have the second logic level and the first input signal IN1 has the first logic level, the pull-down control circuit 221 may float a node, at which the pull-down control signal COND Is generated, without driving the pull-down control signal COND.

The pull-down control circuit 221 may include a pull-up control driver 221-1, a first pull-down control driver 221-2 and a second pull-down control driver 221-3. The pull-up control driver 221-1 may receive the first input signal IN1 and the fourth dock signal CK4. The pull-up control driver 221-1 may drive the pull-down control signal COND to the first logic level based on the first input signal IN1 and the fourth dock signal CK4. In synchronization with the fourth clock signal CK4, the pull-down control circuit 221 may detect the logic level of the first input signal IN1. The pull-down control circuit 221 may drive the pull-down control signal COND to the first logic level according to the logic level of the first input signal IN1, In the period when the first input signal IN1 has the first logic level or the fourth dock signal CK4 has the first logic level, the pull-up control driver 221-1 may not drive the pull-down control signal COND to the first logic level. In the period when the fourth dock signal CK4 has the second logic level, the pull-up control driver 221-1 may drive the pull-down control signal COND to the first logic level when the first input signal IN1 has the second logic level.

The first pull-down control driver 221-2 may receive the first dock signal CK1. In the period when the first clock signal CK1 has the first logic level, the first pull-down control driver 221-2 may drive the pull-down control signal COND to the second logic level. In the period when the first clock signal CK1 has the second logic level, the first pull-down control driver 221-2 may not drive the pull-down control signal COND. The second pull-down control driver 221-3 may receive the fourth dock signal CK4. In the period when the fourth dock signal CK4 has the first logic level, the second pull-down control driver 221-3 may drive the pull-down control signal COND to the second logic level. In the period when the fourth clock signal CK4 has the second logic level, the second pull-down control driver 221-3 may not drive the pull-down control signal COND, The drivability, with which each of the first pull-down control driver 221-2 and the second pull-down control driver 221-3 drives the pull-down control signal COND to the second logic level, may be greater than the drivability, with which the pull-up control driver 221-1 drives the pull-down control signal COND to the first logic level.

The pull-down driver 222 may receive the pull-down control signal COND. The pull-down driver 222 may drive the output node ON to the second logic level based on the pull-down control signal COND. For example, when the pull-down control signal COND has the second logic level or floats, the pull-down driver 222 may not drive the output node ON to the second logic level. When the pull-down control signal COND has the first logic level, the pull-down driver 222 may drive the output node ON to the second logic level. The drivability, with which the pull-down driver 222 drives the output node ON to the second logic level, may be greater than the drivability, with which the precharge circuit 210 precharges the output node ON. Thus, drivability of the output signal OUT is determined by whichever of the drivabilities achieved by the precharge circuit 210 and the pull-down driver 222 is greater.

The pull-up control driver 2214 may include a NOR gate NR, an inverter INV and a second transistor T22. The NOR gate NR may receive the first input signal IN1 and the fourth dock signal CK4. The inverter INV may receive an output of the NOR gate NR. The inverter INV may inversely drive the output of the NOR gate NR to output a pull-up control signal CONP. The NOR gate NR and the inverter INV may operate together as an OR gate configured to output a signal having a high logic level when any one between the first input signal IN1 and the fourth clock signal CK4 has a high logic level. The NOR gate NR and the inverter INV may output a signal having a low logic level when both the first input signal IN1 and the fourth clock signal CK4 have a low logic level. Therefore, when the fourth clock signal CK4 transitions to a low logic level, the NOR gate NR and the inverter INV may change the logic level of the pull-up control signal CONP according to the logic level of the first input signal IN1. The second transistor T22 may be a P-channel MOS transistor. The second transistor T22 may receive the output of the inverter INV at its gate, may receive the first voltage V1 at is source and may be coupled to a node, at which the pull-down control signal COND is generated, at its drain.

The first pull-down control driver 221-2 may include a third transistor T23. The third transistor T23 may be a N-channel MOS transistor. The third transistor T23 may receive the first clock signal CK1 at its gate, may be coupled to the node, at which the pull-down control signal COND is generated, at its drain and may receive a second voltage V2 at its source. The second voltage V2 may have a lower voltage level than the first voltage V1 and may have a voltage level low enough to be determined as a low logic level. The third transistor T23 may drive the pull-down control signal COND to the second voltage V2 when the first clock signal CK1 has a high logic level and may float the node, at which the pull-down control signal COND is generated, when the first clock signal CK1 has a low logic level.

The second pull-down control driver 221-3 may include a fourth transistor T24. The fourth transistor T24 may be a N-channel MOS transistor. The fourth transistor 124 may receive the fourth clock signal CK4 at its gate, may be coupled to the node, at which the pull-down control signal COND is generated, at its drain and may receive the second voltage V2 at its source. The fourth transistor T24 may drive the pull-down control signal COND to the second voltage V2 when the first clock signal CK1 has a high logic level and may float the node, at which the pull-down control signal COND is generated, when the first clock signal CK1 has a low logic level. The size and/or the current drivability of each of the third transistor T23 and the fourth transistor T24 may be greater than the size and/or the current drivability of the second transistor T22.

The pull-down driver 222 may include a fifth transistor T25. The fifth transistor T25 may be a N-channel MOS transistor. The fifth transistor T25 may receive the pull-down control signal COND at its gate, may be coupled to the output node ON at its drain and may receive the second voltage V2 at its source. The fifth transistor T25 may drive the output node ON to the second voltage V2 when the pull-down control signal COND has a high logic level and may not drive the output node ON when the pull-down control signal COND has a low logic level. The size and/or the current drivability of the fifth transistor T25 may be greater than the size and/or the current drivability of the first transistor T21.

Figure 3:
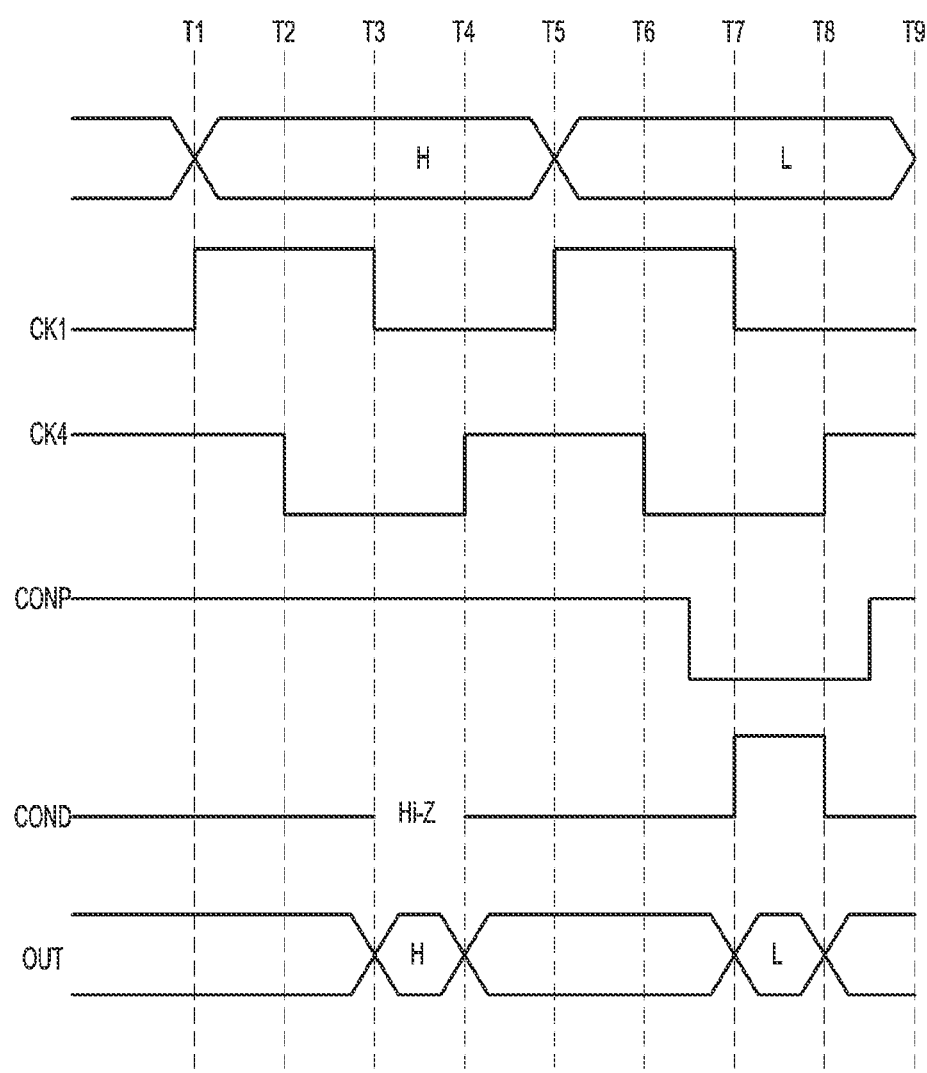
FIG. 3 is a timing diagram illustrating an example of an operation of a first synchronization circuit illustrated in FIG. 2.

FIG. 3 is a timing diagram illustrating an operation of the first synchronization circuit 110 illustrated in FIG. 2. Hereinafter, described with reference to FIGS. 2 and 3 will be the operation of the first synchronization circuit 110, In this example, the first input signal IN1 may have 4 unit intervals (UIs). However, this disclosure is not limited thereto. 1 UI may correspond to a quarter of the period of the first clock signal CK1 and 4 UIs may correspond to the single period of the first clock signal CK1. The first input signal IN1 may include different information at 4 UIs. The different information may have the same logic level or may have different logic levels. For example, the first input signal IN1 may have any one between a high logic level and a low logic level in a first 4 UIs. Then, the first input signal IN1 may be kept to the same logic level or may transition to a different logic level in a second 4 UIs. In this example, the first input signal IN1 has a high logic level H in a first 4 UIs (i.e., in a period from T1 to T5) and has a low logic level L in a second 4 UIs (i.e., in a period from T5 to T9). The first dock signal CK1 may be synchronized to the first input signal IN1, For example, a rising edge of the first clock signal CK1 may be synchronized to timings (i.e., T1 and T5) at which 4 UIs of the first input signal IN1 start. At T1, the precharge circuit 210 may precharge the output node ON to a high logic level. From T1 to T2, the fourth dock signal CK4 may have a high logic level and thus the pull-up control signal CONP may have a high logic level, At T2, the fourth dock signal CK4 may transition to a low logic level but the first input signal IN1 has a high logic level, and thus the pull-up control signal CONP may be kept to a high logic level. Therefore, the pull-up control driver 221-1 may not drive the pull-down control signal COND. From T1 to T3, the first clock signal CK1 may have a high logic level and thus the first pull-down control driver 221-2 may drive the pull-down control signal COND to a low logic level. From T1 to T2 and from T4 to T5, the fourth clock signal CK4 may have a high logic level and thus the second pull-down control driver 221-3 may drive the pull-down control signal COND to a low logic level. At T3, the first clock signal CK1 may transition to a low logic level and thus the first pull-down control driver 221-2 and the second pull-down control driver 221-3 may not drive the pull-down control signal COND. However, the pull-up control signal CONP may be kept to a high logic level and thus the pull-up control driver 221-1 may not drive the pull-down control signal COND. Therefore, between T3 and T4, the pull-down control signal COND may float, i.e., may stay in high impedance (Hi-Z) status and the pull-down driver 222 may not drive the output node ON to a low logic level. Between T3 and T4, the voltage level of the output node ON may be kept to a high logic level and the logic level of the output signal OUT may be defined as a high logic level H. From T4 to T5, the fourth dock signal CK4 may have a high logic level and thus the pull-down control signal COND may be driven to a low logic level and the output node ON may be precharged again to a high logic level by the precharge circuit 210.

From T5 to T6, the fourth clock signal CK4 may have a high logic level and thus the pull-up control signal CONP may be kept to a high logic level and the pull-up control driver 221-1 may not drive the pull-down control signal COND. From T5 to T7, the first pull-down control driver 221-2 and the second pull-down control driver 221-3 may drive the pull-down control signal COND to a low logic level. When the fourth clock signal CK4 transitions to a low logic level at T6, the pull-up control driver 221-1 may drive the pull-up control signal CONP to a low logic level according to the logic level of the first input signal IN1. Between T6 and T8, the fourth clock signal CK4 has a low logic level and the first input signal IN1 has a low logic level, and thus the pull-up control signal CONP may transition to a low logic level. The NOR gate NR and the inverter INV may cause delay as the first input signal IN1 and the fourth clock signal CK4 are processed, and thus, the pull-up control signal CONP may transition to a low logic level between T6 and T7 and may transition to a high logic level between T8 and T9, actually. Therefore, the pull-up control driver 221-1 may drive the pull-down control signal COND to a high logic level. However, the first pull-down control driver 221-2 may keep driving the pull-down control signal COND to a low logic level and thus, the pull-down control signal COND may be kept to a low logic level. When the first clock signal CK1 transitions to a low logic level at T7, the first pull-down control driver 221-2 may not drive the pull-down control signal COND. Therefore, between T7 and T8, the pull-down control signal COND may have a high logic level due to the pull-up control driver 221-1, The pull-down driver 222 may drive the output node ON to a low logic level based on the pull-down control signal COND and the logic level of the output signal OUT may be defined as a low logic level L. At T8, the fourth clock signal CK4 may transition to a high logic level and the pull-down control signal COND may transition back to a low logic level. Therefore, the precharge circuit 210 may precharge the output node ON to a high logic level.

When the fourth clock signal CK4 having the phase leading the first clock signal CK1 has a low logic level, the first synchronization circuit 110 may drive the pull-down control signal COND to a high logic level according to the logic level of the first input signal IN1. After that, the pull-down driver 222 is driven by the pull-down control signal COND at a time point when the first clock signal CK1 transitions to a low logic level, and thus, the first synchronization circuit 110 may precisely generate the output signal OUT having the logic level corresponding to the logic level of the first input signal IN1. That is, there may be enough time margin for changing the voltage level of the pull-down control signal COND because the pull-up control signal CONP may have 2 UIs based on the fourth dock signal CK4. Further, the operational reliability of the first synchronization circuit 110 may be improved because the pull-down driver 222 drives the output node ON to a low logic level at a time point when the first clock signal CK1 transitions to a low logic level. Still further, an operational speed of the first synchronization circuit 110 may be faster because the first synchronization circuit 110 has the structure that the first clock signal CK1 affects the voltage level change of the output node ON via only two elements, i.e., the fourth transistor T24 and the fifth transistor T25. Still further, the amount of current consumed by the first synchronization circuit 110 may be reduced because the pull-down control driver 222 is turned on only in the period when both the first clock signal CK1 and the fourth clock signal CK4 have a low logic level but the current path through the pull-down drivers is blocked in other periods.

Figure 4:
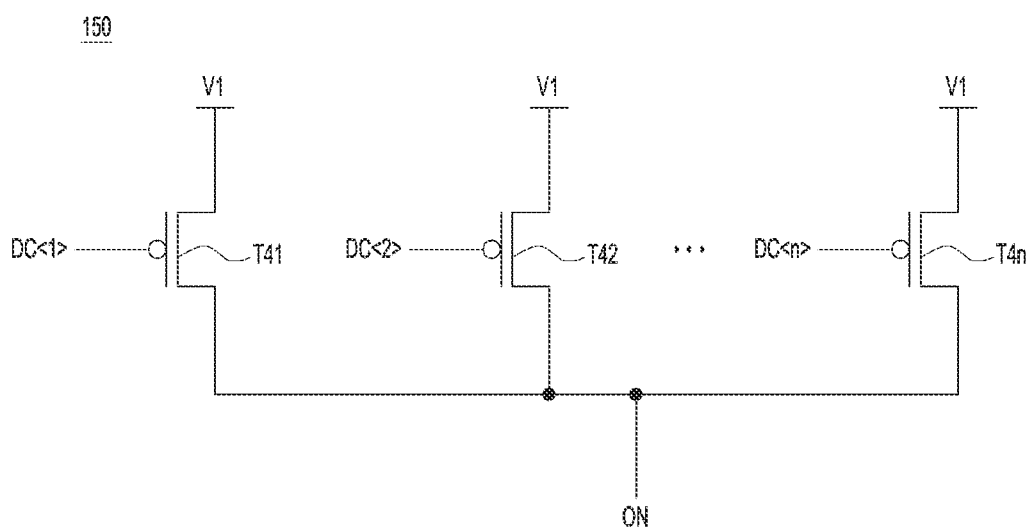
FIG. 4 is a diagram illustrating an example of a configuration of a duty correction circuit illustrated in FIG. 1.

FIG. 4 is a diagram illustrating a configuration of the duty correction circuit 150 illustrated in FIG. 1. Referring to FIG. 4, the duty correction circuit 150 may include a plurality of transistors. The duty correction circuit 150 may include the transistors, a number of which corresponds to the number of bits of the duty control signal DC<1:n>. The duty correction circuit 150 may include a first transistor T41, a second transistor T42 and up to and including an n-th transistor T4n, as is illustrated in FIG. 4. Each of the first transistor T41, the second transistor T42 and up to and including the n-th transistor T4n may be a P-channel MOS transistor. The first transistor T41 may receive a first bit DC<1> of the duty control signal DC<1:n> and may provide the output node ON with the first voltage V1. The second transistor T42 may receive a second bit DC<2> of the duty control signal DC<1:n> and may provide the output node ON with the first voltage V1. The n-th transistor T4n may receive a n-th bit DC<n> of the duty control signal DC<1:n> and may provide the output node ON with the first voltage V1. The duty correction circuit 150 may be a variable current source, According to a logic value of the duty control signal DC<1:n>, the duty correction circuit 150 may change an amount of current provided from the node, from which the first voltage V1 is supplied, to the output node ON, thereby changing the voltage level of the output node ON. In an embodiment, each of the first transistor 141, the second transistor T42 and up to and including the n-th transistor (where n may be an integer greater than zero) T4n may be modified to a N-channel MOS transistor and may be modified to provide the output node ON with the second voltage V2 based on the duty control signal DC<1:n>.

Figure 5:
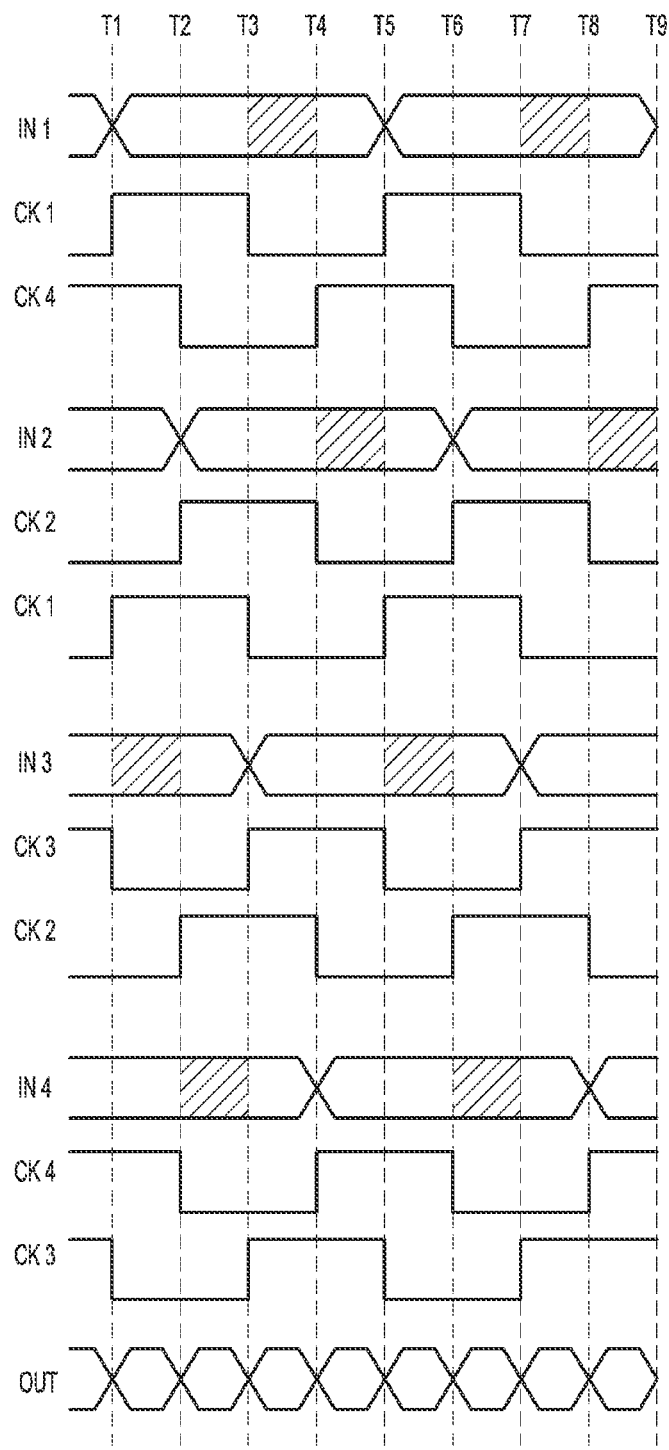
FIG. 5 is a timing diagram illustrating an example of an operation of a serializer in accordance with an embodiment of the present disclosure.

FIG. 5 is a timing diagram illustrating an operation of the serializer 100 in accordance with an embodiment. Hereinafter, described with reference to FIGS. 1 and 5 will be the operation of the serializer 100. In an embodiment, each of the first to fourth input signals IN1, IN2, IN3 and IN4 may have a single piece of information for 4 UIs and may change to have the same information or different information at 4 UIs. The first to fourth input signals IN1, IN2, IN3 and IN4 may be synchronized to the first to fourth dock signals CK1, CK2, CK3 and CK4, respectively. The first to fourth input signals IN1, IN2, IN3 and IN4 may sequentially have a phase difference corresponding to an amount of the unit phase, i.e., 1 UI with each other. The first input signal IN1 may by synchronized to the rising edge of the first dock signal CK1 at T1 and T5. The second input signal IN2 may be synchronized to the rising edge of the second dock signal CK2 at T2 and T6. The third input signal IN3 may by synchronized to the rising edge of the third clock signal CK3 at T3 and T7. The fourth input signal IN4 may by synchronized to the rising edge of the fourth dock signal CK4 at T4 and T8. Between T1 and T2, both the second clock signal CK2 and the third dock signal CK3 may have a low logic level and thus the third synchronization circuit 130 may generate the output signal OUT corresponding to the logic level of the third input signal IN3. Between T2 and T3, both the third dock signal CK3 and the fourth dock signal CK4 may have a low logic level and thus, the fourth synchronization circuit 140 may generate the output signal OUT corresponding to the logic level of the fourth input signal IN4, Between T3 and T4, both the first clock signal CK1 and the fourth clock signal CK4 may have a low logic level and thus the first synchronization circuit 110 may generate the output signal OUT corresponding to the logic level of the first input signal IN1. Between T4 and T5, both the first clock signal CK1 and the second clock signal CK2 may have a low logic level and thus the second synchronization circuit 120 may generate the output signal OUT corresponding to the logic level of the second input signal IN2, After that, between T5 and T9, the output signal OUT corresponding to the logic levels of the third input signal IN3, the fourth input signal IN4, the first input signal IN1 and the second input signal IN2 may be sequentially output with the interval of the unit phase.

Figure 6:
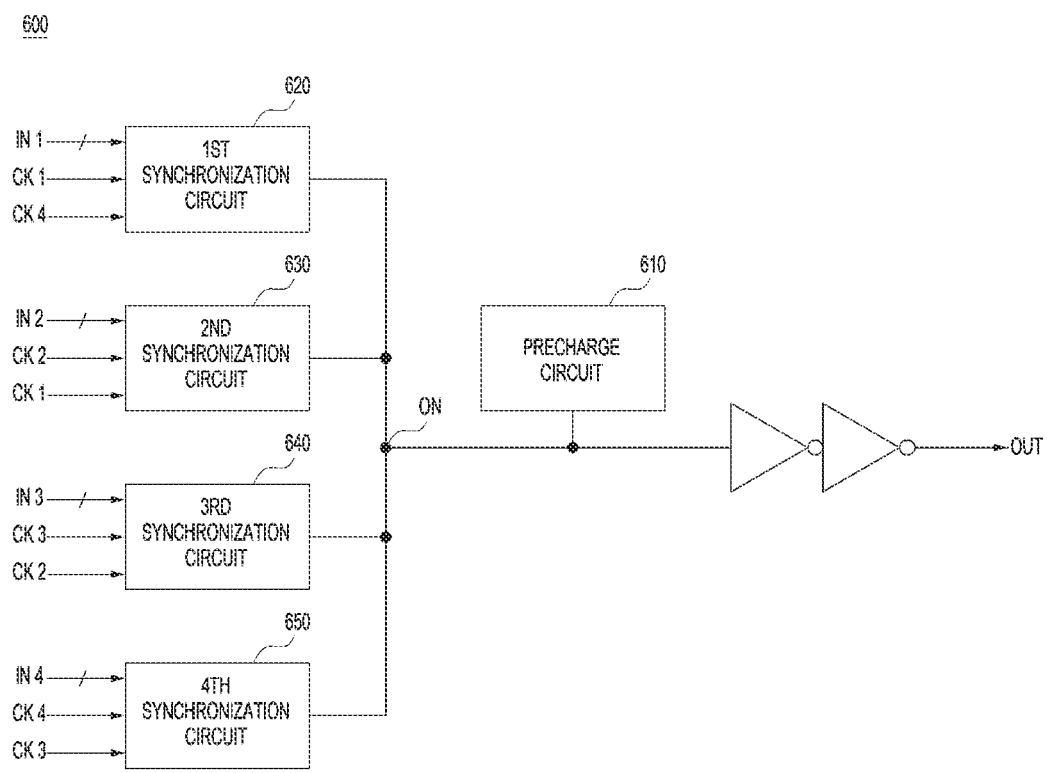
FIG. 6 is a diagram illustrating a configuration of an example of a serializer in accordance with an embodiment of the present disclosure.

FIG. 6 is a diagram illustrating an example of a configuration of a serializer 600 in accordance with an embodiment of the present disclosure, Referring to FIG. 6, the serializer 600 may include a precharge circuit 610, a first synchronization circuit 620, a second synchronization circuit 630, a third synchronization circuit 640 and a fourth synchronization circuit 650. The precharge circuit 610 may precharge an output node ON to the first logic level. The first synchronization circuit 620 may receive a first dock signal CK1, a fourth dock signal CK4 and a first input signal IN1. The fourth dock signal CK4 may have a phase leading the first clock signal CK1 by an amount of a unit phase. In synchronization with the fourth dock signal CK4 having the leading phase, the first synchronization circuit 620 may detect a logic level of the first input signal IN1. In synchronization with the first dock signal CK1, the first synchronization circuit 620 may generate an output signal OUT corresponding to the logic level of the first input signal IN1. The first synchronization circuit 620 may drive the output node ON to the second logic level based on the first input signal IN1 in a period from a falling edge of the first clock signal CK1 to a rising edge of the fourth dock signal CK4. The second synchronization circuit 630 may receive a second dock signal CK2, the first dock signal CK1, and a second input signal IN2. The first dock signal CK1 may have a phase leading the second dock signal CK2 by an amount of the unit phase. In synchronization with the first dock signal CK1 having the leading phase, the second synchronization circuit 630 may detect a logic level of the second input signal IN2. In synchronization with the second dock signal CK2, the second synchronization circuit 630 may generate the output signal OUT corresponding to the logic level of the second input signal IN2. The second synchronization circuit 630 may drive the output node ON to the second logic level based on the second input signal IN2 in a period from a falling edge of the second dock signal CK2 to a rising edge of the first dock signal CK1, The third synchronization circuit 640 may receive a third dock signal CK3, the second clock signal CK2 and a third input signal IN3. The second clock signal CK2 may have a phase leading the third clock signal CK3 by an amount of the unit phase. In synchronization with the second clock signal CK2 having the leading phase, the third synchronization circuit 640 may detect a logic level of the third input signal IN3, In synchronization with the third clock signal CK3, the third synchronization circuit 640 may generate the output signal OUT corresponding to the logic level of the third input signal IN3. The third synchronization circuit 640 may drive the output node ON to the second logic level based on the third input signal IN3 in a period from a falling edge of the third clock signal CK3 to a rising edge of the second clock signal CK2. The fourth synchronization circuit 650 may receive the fourth clock signal CK4, the third clock signal CK3, and a fourth input signal IN4. The third clock signal CK3 may have a phase leading the fourth clock signal CK4 by an amount of the unit phase. In synchronization with the third clock signal CK3 having the leading phase, the fourth synchronization circuit 650 may detect a logic level of the fourth input signal IN4. In synchronization with the fourth clock signal CK4, the fourth synchronization circuit 650 may generate the output signal OUT corresponding to the logic level of the fourth input signal IN4, The fourth synchronization circuit 650 may drive the output node ON to the second logic level based on the fourth input signal IN4 in a period from a falling edge of the fourth clock signal CK4 to a rising edge of the third clock signal CK3. The first to fourth synchronization circuits 620, 630, 640 and 650 may commonly utilize the single precharge circuit 610. The precharge circuit 610 may include the configuration of the precharge circuit 210 among the configurations of the first synchronization circuit 110 illustrated in FIG. 2. Each of the first to fourth synchronization circuits 620, 630, 640 and 650 may include remaining configurations except the precharge circuit 210 among the configurations of the first synchronization circuit 110 illustrated in FIG. 2.

Figure 7:
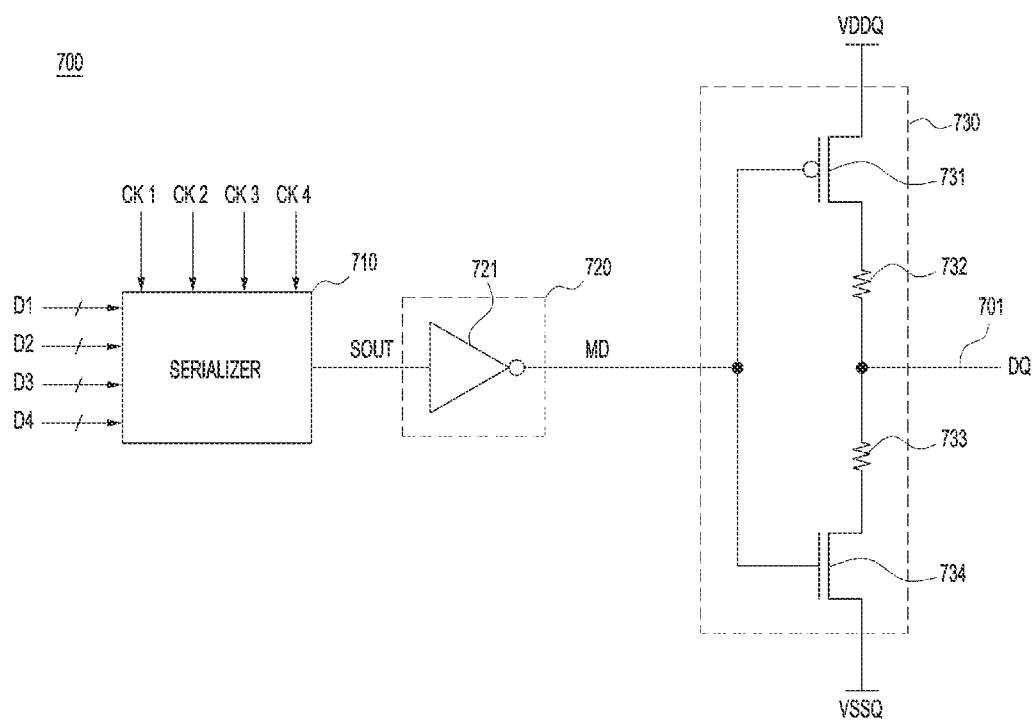
FIG. 7 is a diagram illustrating an example of a configuration of a data output circuit in accordance with an embodiment of the present disclosure.

FIG. 7 is a diagram illustrating a configuration of an embodiment of a data output circuit 700 in accordance with an embodiment of the present disclosure. Referring to FIG. 7, the data output circuit 700 may include a serializer 710, a pre-driver 720 and a main driver 730, The serializer 710 may receive a first clock signal CK1, a second dock signal CK2, a third dock signal CK3, a fourth dock signal CK4 and a plurality of data signals. The first to fourth dock signals CK1, CK2, CK3 and CK4 may sequentially have a phase difference corresponding to an amount of a unit phase with each other. In synchronization with the first to fourth dock signals CK1, CK2, CK3 and CK4, the serializer 710 may sequentially output the plurality of data signals as a serial data signal SOUT. For convenience of description, it is exemplified that the plurality of data signals include a first data signal D1, a second data signal D2, a third data signal D3 and a fourth data signal D4. The serializer 710 may sequentially output the serial data signal SOUT having logic levels corresponding to the respective first to fourth data signals D1, D2, D3 and D4 at falling edges of the respective first to fourth clock signals CK1, CK2, CK3 and CK4. Any one between the serializers 100 and 600 respectively illustrated in FIGS. 1 and 6 may be applied as the serializer 710.

The pre-driver 720 may receive the serial data signal SOUT and may generate an output control signal MD based on the serial data signal SOUT. For example, the pre-driver 720 may inversely drive the serial data signal SOUT to generate the output control signal MD having a logic level complementary to the serial data signal SOUL The pre-driver 720 may include a driver 721, wherein the driver 721 may inversely drive the serial data signal SOUT to output the output control signal MD.

The main driver 730 may receive the output control signal MD from the pre-driver 720. The main driver 730 may be coupled to the data transmission line 701 and may drive the data transmission line 701 to a high logic level or a low logic level based on the output control signal MD. The data transmission line 701 may be a data bus coupled between a semiconductor apparatus, which includes the data output circuit 700, and another semiconductor apparatus. When the data transmission line 701 is driven to a high logic level or a low logic level, data DQ may be transmitted through the data transmission line 701, The main driver 730 may drive the data transmission line 701 to a high logic level when the output control signal MD has a low logic level and may drive the data transmission line 701 to a low logic level when the output control signal MD has a high logic level.

The main driver 730 may include a pull-up transistor 731, a first resistor 732, a second resistor 733 and a pull-down transistor 734, The pull-up transistor 731 may be a pull-up driver configured to pull-up drive the data transmission line 701. The pull-up transistor 731 may be a P-channel MOS transistor. The pull-up transistor 731 may receive the output control signal MD at its gate and may receive a first data power voltage VDDQ at its source. The first data power voltage VDDQ may have a voltage level high enough to be determined as a high logic level. The first data power voltage VDDQ may have the same voltage level as or a different voltage level from the first voltage V1 illustrated in FIG. 2. Even if the first data power voltage VDDQ has the same voltage level as the first voltage V1, a source configured to supply the first data power voltage VDDQ may be different from a source configured to supply the first voltage V1 in order to prevent a noise from occurring in the data DQ output through the data transmission line 701. The first resistor 732 may be coupled to a drain of the pull-up transistor 731 at one end and may be coupled to the data transmission line 701 at the other end. In an embodiment, the first resistor 732 may be modified to be coupled to a node, from which the first data power voltage VDDQ is provided, at one end and the pull-up transistor 731 may be modified to be coupled between the other end of the first resistor 732 and the data transmission line 701.

Figure 8:
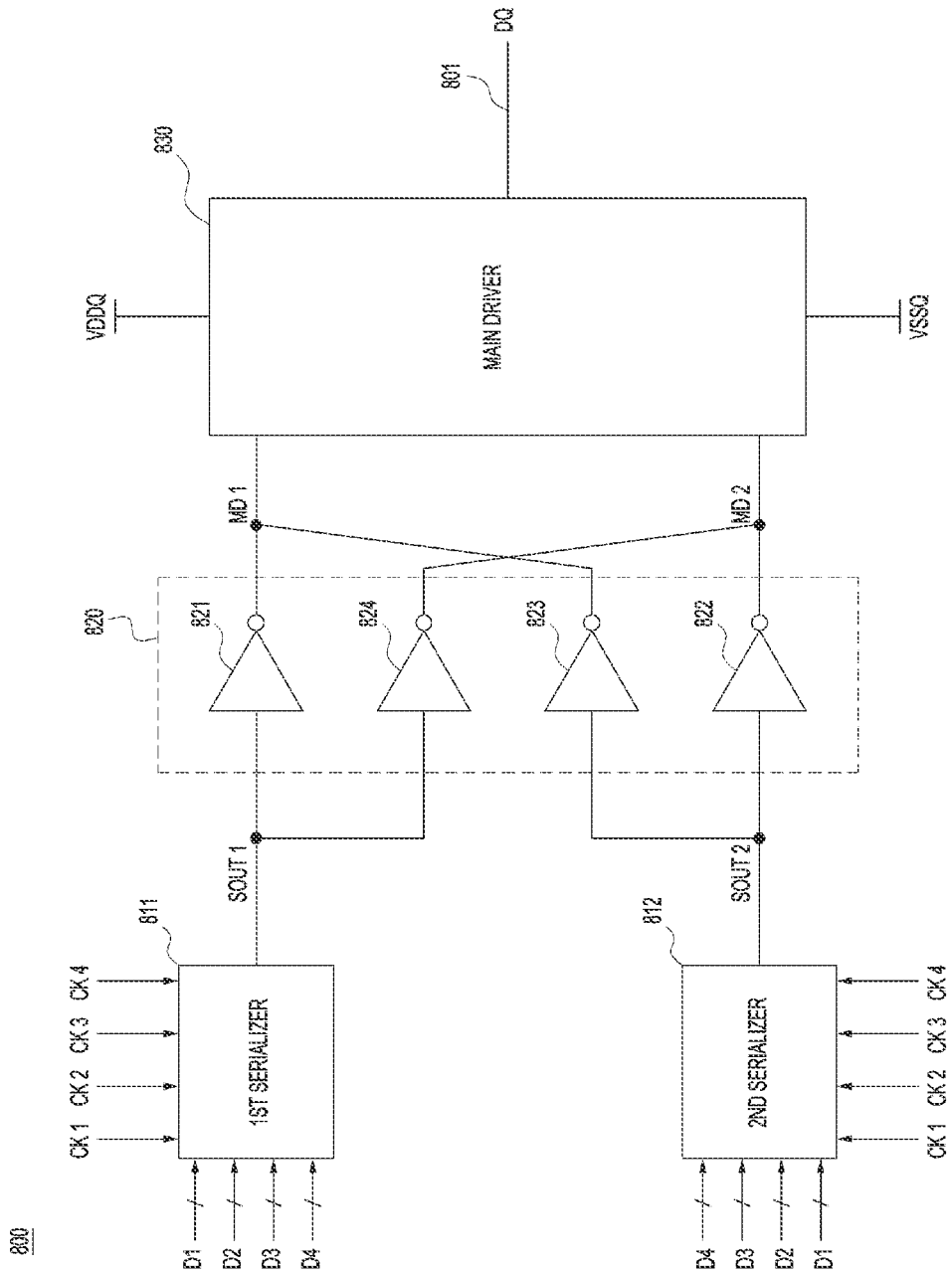
FIG. 8 is a diagram illustrating a configuration of an example of a data output circuit in accordance with an embodiment of the present disclosure.

The second resistor 733 may be coupled to the data transmission line 701 at one end. The pull-down transistor 734 may be a pull-down driver configured to pull-down drive the data transmission line 701. The pull-down transistor 734 may be a N-channel MOS transistor. The pull-down transistor 734 may receive the output control signal MD at its gate, may be coupled to the other end of the second resistor 733 at its drain and may receive a second data power voltage VSSQ at its source. The second data power voltage VSSQ may have a lower voltage level than the first data power voltage VDDQ. The second data power voltage VSSQ may have a voltage level low enough to be determined as a low logic level. The second data power voltage VSSQ may have the same voltage level as or a different voltage level from the second voltage V2 illustrated in FIG. 2. Even if the second data power voltage VSSQ has the same voltage level as the second voltage V2, a source configured to supply the second data power voltage VSSQ may be different from a source configured to supply the second voltage V2 in order to prevent a noise from occurring in the data DQ output through the data transmission line 701. In an embodiment, the second resistor 733 may be modified to be coupled to a node, from which the second data power voltage VSSQ is provided, at the other end and the pull-down transistor 734 may be modified to be coupled between the one end of the second resistor 733 and the data transmission line 701, FIG. 8 is a diagram illustrating an embodiment of a configuration of a data output circuit 800 in accordance with an embodiment of the present disclosure. Referring to FIG. 8, the data output circuit 800 may include a first serializer 811, a second serializer 812, a pre-driver 820 and a main driver 830. The first serializer 811 and the second serializer 812 may commonly receive a first clock signal CK1, a second clock signal CK2, a third clock signal CK3, a fourth clock signal CK4, a first data signal D1, a second data signal D2, a third data signal D3 and a fourth data signal D4, Based on the first to fourth clock signals CK1, CK2, CK3 and CK4, the first serializer 811 may sequentially output the first to fourth data signals D1, D2, D3 and D4 as a first serial data signal SOUT1. Based on the first to fourth clock signals CK1, CK2, CK3 and CK4, the second serializer 812 may sequentially output the first to fourth data signals D1, D2, D3 and D4 as a second serial data signal SOUT2. The first serializer 811 and the second serializer 812 may have the same configuration as each other. For example, any one of the serializers 100 and 600 respectively illustrated in FIGS. 1 and 6 may be applied as each of the first serializer 811 and the second serializer 812.

The pre-driver 820 may be coupled to the first serializer 811 and the second serializer 812. The pre-driver 820 may receive the first serial data signal SOUT1 and the second serial data signal SOUT2. The pre-driver 820 may generate a first output control signal MD1 based on the first serial data signal SOUT1. The pre-driver 820 may generate a second output control signal MD2 based on the second serial data signal SOUT2.

The main driver 830 may receive the first output control signal MD1 and the second output control signal MD2 from the pre-driver 820. Based on the first output control signal MD1 and the second output control signal MD2, the main driver 830 may drive a data transmission line 801 to a high logic level or a low logic level. The main driver 830 may drive the data transmission line 801 to a high logic level based on the first output control signal MD1 and may drive the data transmission line 801 to a low logic level based on the second output control signal MD2, That is, the main driver 830 may pull-up drive the data transmission line 801 based on the first output control signal MD1 and may pull-down drive the data transmission line 801 based on the second output control signal MD2, In an embodiment, the main driver 830 may drive the data transmission line 801 to a high logic level based on both the first output control signal MD1 and the second output control signal MD2 and may drive the data transmission line 801 to a low logic level based on both the first output control signal MD1 and the second output control signal MD2.

As illustrated in FIG. 8, when the data output circuit 800 includes two serializers, which are coupled in parallel, drivability for driving a pull-up control driver and a pull-down control driver included in the main driver 830 may be distributed. Therefore, drivability of the pre-driver 820 and an area occupied by the pre-driver 820 may be minimized. However, when the data output circuit 800 includes two serializers, mismatch may occur between the first output control signal MD1, which is generated on the basis of the first serial data signal SOUT1 output from the first serializer 811, and the second output control signal MD2, which is generated on the basis of the second serial data signal SOUT2 output from the second serializer 812, due to local process variation. In order to solve this issue, the pre-driver 820 may generate the first output control signal MD1 by mixing the second output control signal MD2 into the first output control signal MD1 and may generate the second output control signal MD2 by mixing the first output control signal MD1 into the second output control signal MD2. By mixing the phases of the first output control signal MD1 and the second output control signal MD2 in this way by the pre-driver 820, the first output control signal MD1 and the second output control signal MD2 may have phases corresponding to a middle of the phase difference of the mismatch. Therefore, the mismatch caused due to the local process variation may be compensated for and the performance of the data output circuit 800 may be improved.

The pre-driver 820 may include a first driver 821, a second driver 822, a third driver 823, and a fourth driver 824. The first driver 821 and the fourth driver 824 may commonly receive the first serial data signal SOUT1. The second driver 822 and the third driver 823 may commonly receive the second serial data signal SOUT2. The first driver 821 and the third driver 823 may generate the first output control signal MD1. The second driver 822 and the fourth driver 824 may generate the second output control signal MD2. The first driver 821 may inversely drive the first serial data signal SOUT1 to generate the first output control signal MD1. The second driver 822 may inversely drive the second serial data signal SOUT2 to generate the second output control signal MD2. The third driver 823 may inversely drive the second serial data signal SOUT2 to generate the first output control signal MD1. The fourth driver 824 may inversely drive the first serial data signal SOUT1 to generate the second output control signal MD2.

Figure 9A:
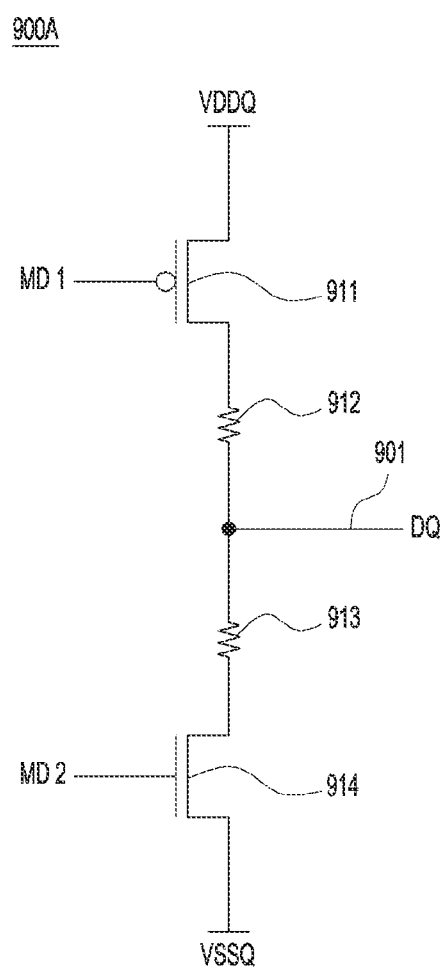
FIGS. 9A and 9B are diagrams illustrating configurations of examples of main drivers in accordance with an embodiment of the present disclosure.

FIG. 9A is a diagram illustrating an embodiment of a configuration of a main driver 900A in accordance with an embodiment of the present disclosure. The main driver 900A may be applied as the main driver 830 illustrated in FIG. 8. Referring to FIG. 9A, the main driver 900A may include a pull-up transistor 911, a first resistor 912, a second resistor 913 and a pull-down transistor 914. The pull-up transistor 911 may be a pull-up driver configured to pull-up drive a data transmission line 901. The pull-up transistor 911 may be a P-channel MOS transistor. The pull-up transistor 911 may receive the first output control signal MD1 at its gate and may receive the first data power voltage VDDQ at its source. The first resistor 912 may be coupled to a drain of the pull-up transistor 911 at one end and may be coupled to the data transmission line 901 at the other end. In an embodiment, the first resistor 912 may be modified to be coupled to a node, from which the first data power voltage VDDQ is provided, at one end and the pull-up transistor 911 may be modified to be coupled between the other end of the first resistor 912 and the data transmission line 901.

Figure 9B:
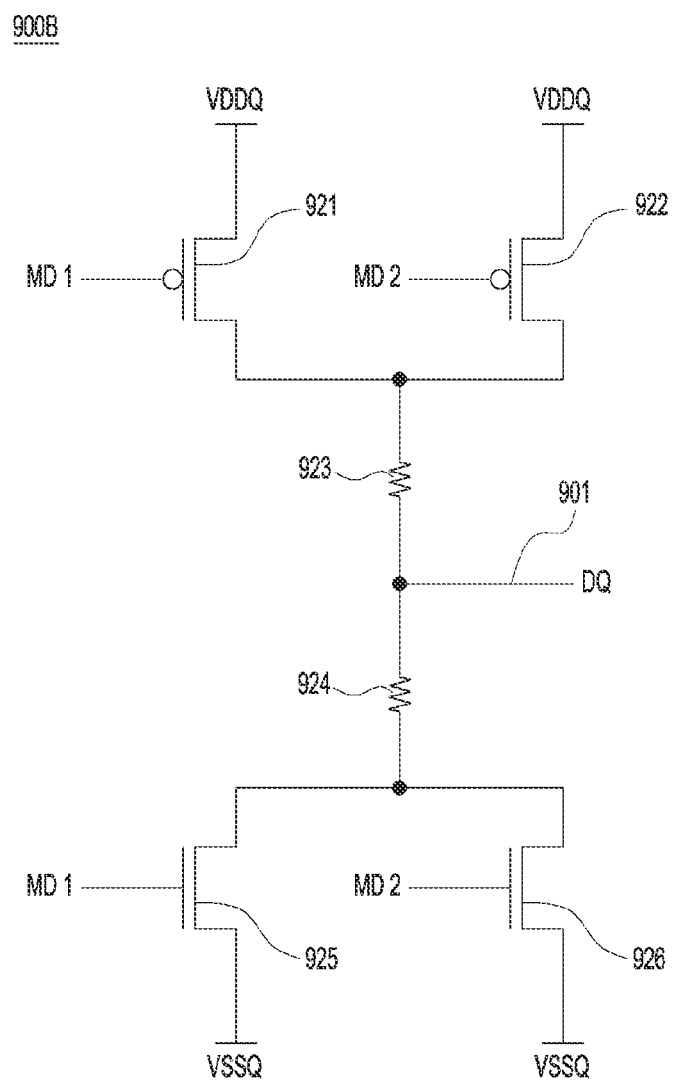

The second resistor 913 may be coupled to the data transmission line 901 at one end. The pull-down transistor 914 may be a pull-down driver configured to pull-down drive the data transmission line 901. The pull-down transistor 914 may be a N-channel MOS transistor. The pull-down transistor 914 may receive the second output control signal MD2 at its gate, may be coupled to the other end of the second resistor 913 at its drain and may receive the second data power voltage VSSQ at its source. In an embodiment, the second resistor 913 may be modified to be coupled to a node, from which the second data power voltage VSSQ is provided, at the other end and the pull-down transistor 914 may be modified to be coupled between the one end of the second resistor 913 and the data transmission line 901, FIG. 9B is a diagram illustrating an embodiment of a configuration of a main driver 900B in accordance with an embodiment of the present disclosure. The main driver 900B may be applied as the main driver 830 illustrated in FIG. 8. Referring to FIG. 9B, the main driver 900B may include a first pull-up transistor 921, a second pull-up transistor 922, a first resistor 923, a second resistor 924, a first pull-down transistor 925 and a second pull-down transistor 926. Each of the first pull-up transistor 921 and the second pull-up transistor 922 may be a pull-up driver configured to pull-up drive the data transmission line 901. Each of the first pull-up transistor 921 and the second pull-up transistor 922 may be a P-channel MOS transistor. The first pull-up transistor 921 may receive the first output control signal MD1 at its gate and may receive the first data power voltage VDDQ at its source. The second pull-up transistor 922 may receive the second output control signal MD2 at its gate and may receive the first data power voltage VDDQ at its source. The first resistor 923 may be commonly coupled to drains of the first pull-up transistor 921 and the second pull-up transistor 922 at one end and may be coupled to the data transmission line 901 at the other end. In an embodiment, the first resistor 923 may be modified to be coupled to a node, from which the first data power voltage VDDQ is provided, at one end and the first pull-up transistor 921 and the second pull-up transistor 922 may be modified to be commonly coupled between the other end of the first resistor 923 and the data transmission line 901.

The second resistor 924 may be coupled to the data transmission line 901 at one end. Each of the first pull-down transistor 925 and the second pull-down transistor 926 may be a pull-down driver configured to pull-down drive the data transmission line 901, Each of the first pull-down transistor 925 and the second pull-down transistor 926 may be a N-channel MOS transistor. The first pull-down transistor 925 may receive the first output control signal MD1 at its gate, may be coupled to the other end of the second resistor 924 at its drain and may receive the second data power voltage VSSQ at its source. The second pull-down transistor 926 may receive the second output control signal MD2 at its gate, may be coupled to the other end of the second resistor 924 at its drain and may receive the second data power voltage VSSQ at its source. In an embodiment, the second resistor 924 may be modified to be coupled to a node, from which the second data power voltage VSSQ is provided, at the other end and the first pull-down transistor 925 and the second pull-down transistor 926 may be modified to be commonly coupled between the one end of the second resistor 924 and the data transmission line 901.

Figure 10:
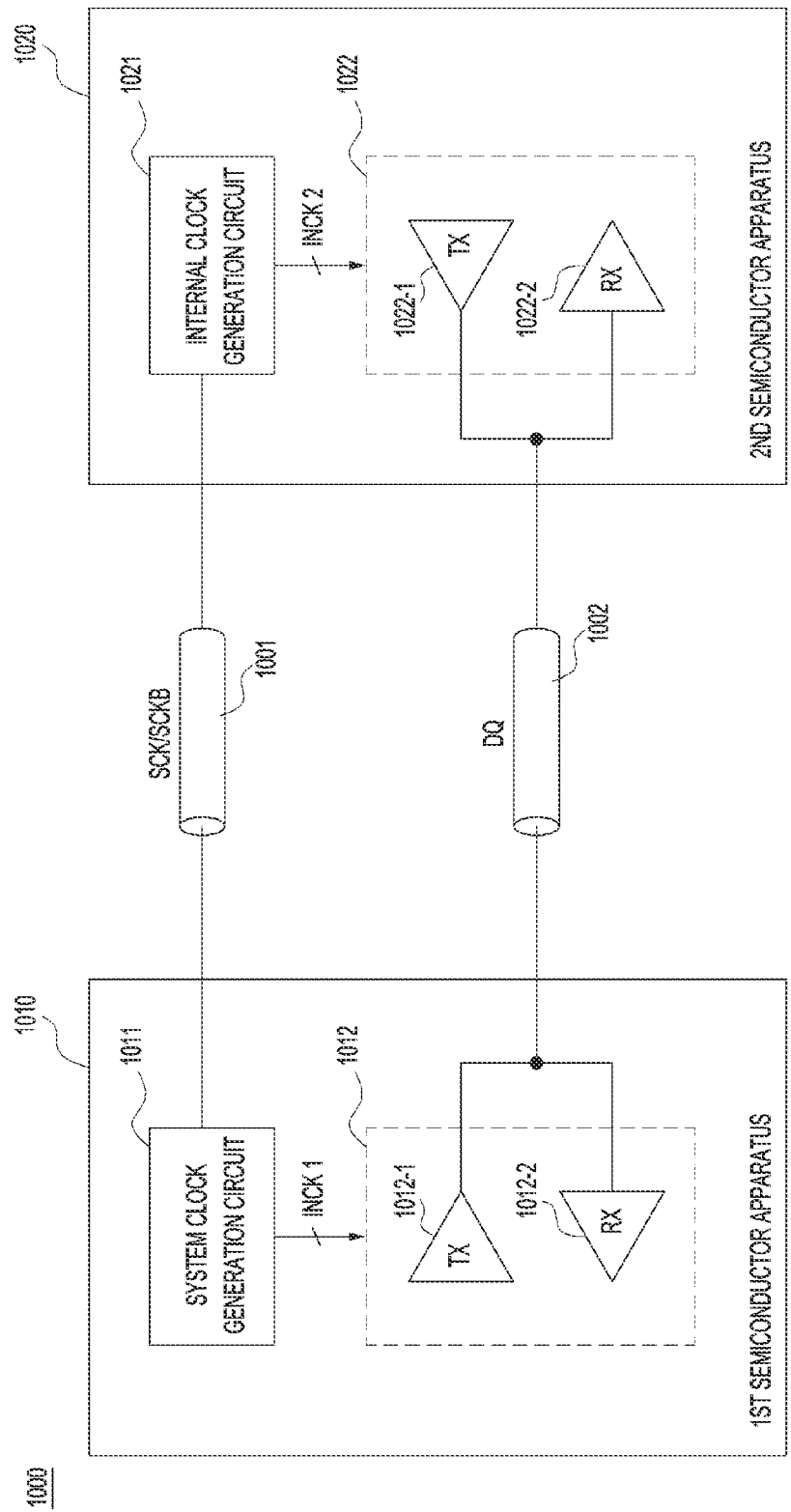
FIG. 10 is a diagram illustrating a configuration of an example of a semiconductor system in accordance with an embodiment of the present disclosure.

FIG. 10 is a diagram illustrating an embodiment of a configuration of a semiconductor system 1000 in accordance with an embodiment of the present disclosure. Referring to FIG. 11, the semiconductor system 1000 may include a first semiconductor apparatus 1010 and a second semiconductor apparatus 1020, The first semiconductor apparatus 1010 may provide various control signals required for the second semiconductor apparatus 1020 to operate. The first semiconductor apparatus 1010 may include various types of devices. For example, the first semiconductor apparatus 1010 may be a host device such as a central processing unit (CPU), a graphic processing unit (GPU), a multi-media processor (MMP), a digital signal processor, an application processor (AP) and a memory controller. For example, the second semiconductor apparatus 1020 may be a memory device and the memory device may include a volatile memory and a non-volatile memory. The volatile memory may include a static random access memory (static RAM: SRAM), a dynamic RAM (DRAM) and a synchronous DRAM (SDRAM), The non-volatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM) and so forth.

The second semiconductor apparatus 1020 may be coupled to the first semiconductor apparatus 1010 through a plurality of buses. The plurality of buses may be a signal transmission path, a link or a channel for transferring a signal. The plurality of buses may include a clock bus 1001 and a data bus 1002. The clock bus 1001 may be a one-way bus and the data bus 1002 may be a two-way bus, Although not illustrated, the semiconductor system 1000 may further include a command bus and an address bus configured to transfer a command signal and an address signal from the first semiconductor apparatus 1010 to the second semiconductor apparatus 1020. The second semiconductor apparatus 1020 may be coupled to the first semiconductor apparatus 1010 through the clock bus 1001 and may receive a system clock signal SCK from the first semiconductor apparatus 1010 through the clock bus 1001. The system dock signal SCK may be transmitted as a single ended signal and may be transmitted, as a differential signal, together with a complementary system clock signal SCKB. The second semiconductor apparatus 1020 may be coupled to the first semiconductor apparatus 1010 through the data bus 1002 and may receive data DQ from the first semiconductor apparatus 1010 and transmit data DQ to the first semiconductor apparatus 1010 through the data bus 1002.

The first semiconductor apparatus 1010 may include a system dock generation circuit 1011 and a data input/output circuit 1012. The system clock generation circuit 1011 may generate the system dock signal SCK, The system clock generation circuit 1011 may provide the second semiconductor apparatus 1120 with the system clock signal SCK through the clock bus 1101. The system clock generation circuit 1011 may generate and transmit the complementary system clock signal SCKB together with the system clock signal SCK. The system clock generation circuit 1011 may include a clock generation circuit such as a ring oscillator and a phase-locked loop circuit. The system clock generation circuit 1011 may generate, from the system clock signal SCK, a plurality of first internal clock signals INCK1 sequentially having a constant phase difference with each other. The first to fourth clock signals CK1, CK2, CK3 and CK4 illustrated in FIG. 1 may correspond to the plurality of first internal dock signals INCK1. The data input/output circuit 1012 may receive the plurality of first internal dock signals INCK1 from the system dock generation circuit 1011. The data input/output circuit 1012 may be coupled to the data bus 1002, may transmit the data DQ through the data bus 1002 and may receive the data DQ provided through the data bus 1002. The data input/output circuit 1012 may transmit the data DQ to the second semiconductor apparatus 1020 in synchronization with the plurality of first internal dock signals INCK1 and may receive the data DQ transmitted from the second semiconductor apparatus 1020 in synchronization with the plurality of first internal dock signals INCK1, The data input/output circuit 1012 may include a data output circuit (TX) 1012-1 and a data input circuit (RX) 1012-2. In synchronization with the plurality of first internal dock signals INCK1, the data output circuit 1012-1 may output, as the data DQ, internal data signal of the first semiconductor apparatus 1010. Any one between the data output circuits 700 and 800 respectively illustrated in FIGS. 7 and 8 may be applied as the data output circuit 1012-1. The internal data signal of the first semiconductor apparatus 1010 may correspond to the plurality of data signals, which the data output circuits 700 and 800 receive. In synchronization with the plurality of first internal clock signals INCK1, the data input circuit 1012-2 may receive the data DQ provided from the second semiconductor apparatus 1020 to generate the internal data signal of the first semiconductor apparatus 1010.

The second semiconductor apparatus 1020 may include an internal clock generation circuit 1021 and a data input/output circuit 1022. The internal dock generation circuit 1021 may be coupled to the dock bus 1001 and may receive the system clock signal SCK and the complementary system clock signal SCKB transferred through the dock bus 1001. The internal clock generation circuit 1021 may include a delay-locked loop circuit configured to generate a delay-locked clock signal by delaying the system clock signal SCK. The internal clock generation circuit 1021 may generate, from the delay-locked dock signal, a plurality of second internal dock signals INCK2 sequentially having a constant phase difference with each other. The first to fourth clock signals CK1, CK2, CK3 and CK4 illustrated in FIG. 1 may correspond to the plurality of second internal clock signals INCK2. The data input/output circuit 1022 may be coupled to the data bus 1002, may transmit the data DQ through the data bus 1002 and may receive the data DQ provided through the data bus 1002. The data input/output circuit 1022 may transmit the data DQ to the first semiconductor apparatus 1010 in synchronization with the plurality of second internal clock signals INCK2 and may receive the data DQ transmitted from the first semiconductor apparatus 1010 in synchronization with the plurality of second internal clock signals INCK2. The data input/output circuit 1022 may include a data output circuit (TX) 1022-1 and a data input circuit (RX) 1022-2. In synchronization with the plurality of second internal clock signals INCK2, the data output circuit 1022-1 may output, as the data DQ, internal data signal of the second semiconductor apparatus 1020. Any one between the data output circuits 700 and 800 respectively illustrated in FIGS. 7 and 8 may be applied as the data output circuit 1022-1. The internal data signal of the second semiconductor apparatus 1020 may correspond to the plurality of data signals, which the data output circuits 700 and 800 receive. In synchronization with the plurality of second internal clock signals INCK2, the data input circuit 1022-2 may receive the data DQ provided from the first semiconductor apparatus 1010 to generate the internal data signal of the second semiconductor apparatus 1020.

While certain embodiments have been described above, it will be understood to those skilled in the art that the embodiments described are by way of example only. Accordingly, the synchronization circuit, a serializer and a data output circuit using the same should not be limited based on the described embodiments, Rather, the synchronization circuit, a serializer and a data output circuit using the same described herein should only be limited in light of the claims that follow when taken in conjunction with the above description and accompanying drawings.

What is claimed is:

1. A synchronization circuit comprising:
   a precharge circuit configured to precharge an output node to a first logic level; and
   a signal driving circuit configured to receive a first clock signal, a second clock signal, and an input signal, the second clock signal having a phase leading the first clock signal, configured to detect, in synchronization with the second clock signal, a logic level of the input signal and configured to drive, in synchronization with the first clock signal, the output node to a second logic level according to the logic level of the input signal.

2. The synchronization circuit of claim 1, wherein a drivability, with which the precharge circuit precharges the output node to the first logic level, is smaller than a drivability, with which the signal driving circuit drives the output node to the second logic level.

3. The synchronization circuit of claim 1, wherein the precharge circuit includes a pull-up driver configured to drive the output node to the first logic level based on an enable signal.

4. The synchronization circuit of claim 1, wherein the signal driving circuit includes:
   a pull-down control circuit configured to generate, in a period when the first clock signal and the second clock signal have the second logic level, a pull-down control signal according to the logic level of the input signal; and
   a pull-down driver configured to drive the output node to the second logic level based on the pull-down control signal.

5. The synchronization circuit of claim 4, wherein the pull-down control circuit includes:
   a pull-up control driver configured to drive the pull-down control signal to the first logic level based on the input signal and the second clock signal;
   a first pull-down control driver configured to drive the pull-down control signal to the second logic level based on the first clock signal; and
   a second pull-down control driver configured to drive the pull-down control signal to the second logic level based on the second clock signal.

6. The synchronization circuit of claim 5, wherein a drivability of each of the first pull-down control driver and the second pull-down control driver is greater than a drivability of the pull-up control driver.

7. A synchronization circuit comprising:
   a pull-up driver configured to drive an output node to a first logic level based on an enable signal;
   a pull-up control driver configured to drive a pull-down control signal to the first logic level based on an input signal and a second clock signal;
   a first pull-down control driver configured to drive the pull-down control signal to a second logic level based on a first clock signal;
   a second pull-down control driver configured to drive the pull-down control signal to the second logic level based on the second clock signal; and
   a pull-down driver configured to drive the output node to the second logic level based on the pull-down control signal,
   wherein the second clock signal has a phase leading the first clock signal.

8. The synchronization circuit of claim 7, wherein a drivability, with which the pull-down driver drives the output node to the second logic level, is greater than a drivability, with which the pull-up driver drives the output node to the first logic level.

9. The synchronization circuit of claim 7, wherein a drivability, with which each of the first pull-down control driver and the second pull-down control driver drives the pull-down control signal to the second logic level, is greater than a drivability, with which the pull-up control driver drives the pull-down control signal to the first logic level.

10. A serializer comprising:
    a first synchronization circuit configured to detect a logic level of a first input signal based on a fourth clock signal having a phase leading a first clock signal by amount of a unit phase and configured to drive an output node according to the logic level of the first input signal based on the first clock signal;
    a second synchronization circuit configured to detect a logic level of a second input signal based on the first clock signal having a phase leading the second clock signal by amount of the unit phase and configured to drive the output node according to the logic level of the second input signal based on the second clock signal;
    a third synchronization circuit configured to detect a logic level of a third input signal based on the second clock signal having a phase leading a third clock signal by the amount of the unit phase and configured to drive the output node according to the logic level of the third input signal based on the third clock signal; and
    a fourth synchronization circuit configured to detect a logic level of a fourth input signal based on the third clock signal having a phase leading the fourth clock signal by amount of the unit phase and configured to drive the output node according to the logic level of the fourth input signal based on the fourth clock signal.

11. The serializer of claim 10, wherein the first synchronization circuit is configured to precharge the output node to a first logic level and configured to drive the output node to a second logic level based on the first input signal in a period when the first clock signal and the fourth clock signal have the second logic level.

12. The serializer of claim 10, wherein the second synchronization circuit is configured to precharge the output node to the first logic level and configured to drive the output node to the second logic level based on the second input signal in a period when the second clock signal and the first clock signal have the second logic level.

13. The serializer of claim 10, wherein the third synchronization circuit is configured to precharge the output node to the first logic level and configured to drive the output node to the second logic level based on the third input signal in a period when the third clock signal and the second clock signal have the second logic level.

14. The serializer of claim 10, wherein the fourth synchronization circuit is configured to precharge the output node to the first logic level and configured to drive the output node to the second logic level based on the fourth input signal in a period when the fourth clock signal and the third clock signal have the second logic level.

15. The serializer of claim 10,
further comprising a duty correction circuit coupled to the output node,
wherein the duty correction circuit is configured to change a voltage level of the output node based on a duty control signal.

16. The serializer of claim 10, further comprising an equalization circuit configured to additionally change, based on a voltage level of the output node changing based on any one input signal among the first to fourth input signals, the voltage level of the output node.

17. A serializer comprising:
a precharge circuit configured to precharge an output node to a first logic level;
a first synchronization circuit configured to receive a first clock signal, a fourth clock signal and a first input signal, the fourth clock signal having a phase leading the first clock signal by an amount of a unit phase, configured to detect a logic level of the first input signal at a falling edge of the fourth clock signal and configured to drive the output node to a second logic level based on the logic level of the first input signal in a period from a falling edge of the first clock signal to a rising edge of the fourth clock signal;
a second synchronization circuit configured to receive a second clock signal, the first clock signal and a second input signal, the first clock signal having a phase leading the second clock signal by the amount of the unit phase, configured to detect a logic level of the second input signal at the falling edge of the first clock signal and configured to drive the output node to the second logic level based on the logic level of the second input signal in a period from a falling edge of the second clock signal to a rising edge of the first clock signal;
a third synchronization circuit configured to receive a third clock signal, the second clock signal and a third input signal, the second clock signal having a phase leading the third clock signal by the amount of the unit phase, configured to detect a logic level of the third input signal at the falling edge of the second clock signal and configured to drive the output node to the second logic level based on the logic level of the third input signal in a period from a falling edge of the third clock signal to a rising edge of the second clock signal; and
a fourth synchronization circuit configured to receive the fourth clock signal, the third clock signal and a fourth input signal, configured to detect a logic level of the fourth input signal at the falling edge of the third clock signal and configured to drive the output node to the second logic level based on the logic level of the fourth input signal in a period from a falling edge of the fourth clock signal to a rising edge of the third clock signal.

18. The serializer of claim 17,
further comprising a duty correction circuit coupled to the output node,
wherein the duty correction circuit is configured to change a voltage level of the output node based on a duty control signal.

19. The serializer of claim 17, further comprising an equalization circuit configured to additionally change, based on a voltage level of the output node changing based on any one input signal among the first to fourth input signals, the voltage level of the output node.

* * * * *